United States Patent [19]

Cutler et al.

[11] 4,386,347
[45] May 31, 1983

[54] METHOD OF, AND APPARATUS FOR, INCREASED RESOLUTION SLEWING OF A BAR-GRAPH-DISPLAY DATA INPUT/OUTPUT SYSTEM

[75] Inventors: Scott E. Cutler; Charles W. Eichelberger, both of Schenectady, N.Y.

[73] Assignee: General Electric Company, Schenectady, N.Y.

[21] Appl. No.: 212,963

[22] Filed: Dec. 4, 1980

[51] Int. Cl.³ ............................................. G09G 3/14
[52] U.S. Cl. ................................ 340/712; 340/365 C; 340/753; 340/802
[58] Field of Search ............ 340/712, 753, 754, 365 C, 340/365 R, 802

[56] References Cited

U.S. PATENT DOCUMENTS

| | | | |
|---|---|---|---|
| 4,112,429 | 9/1978 | Tsuha | 340/756 |
| 4,121,204 | 10/1978 | Welch | 340/712 |
| 4,204,204 | 5/1980 | Pitstick | 340/712 |
| 4,242,676 | 12/1980 | Piguet et al. | 340/365 C |

*Primary Examiner*—Marshall M. Curtis
*Attorney, Agent, or Firm*—Geoffrey H. Krauss; James C. Davis, Jr.; Marvin Snyder

[57] ABSTRACT

A bar-graph-display data input/output system, having increased resolution, utilizes a bar graph display having a number of bar segments greater than the number of associated actuating switch devices. Selection of a given level in the increasing direction is obtained by actuating the next-higher switch; the bar graph starts at a level immediately above that bar segment adjacent to the switch next-lower than the actuated switch and slews, or moves, to each progressively higher position after a fixed time interval at each position, until either the switch is inactivated or the bar reaches the position of the switch activated. In the decreasing direction, the display bar starts at a level immediately below a bar segment directly adjacent to that switch next-higher than the switch actuated, and slews to progressively lower levels, after a similar fixed interval at each position until the activated switch is either inactivated or the bar reaches that segment directly associated with the activated switch. The bar graph, and the associated digital level output data, may be increased or decreased from a present position by actuating higher, or lower, switches.

14 Claims, 12 Drawing Figures

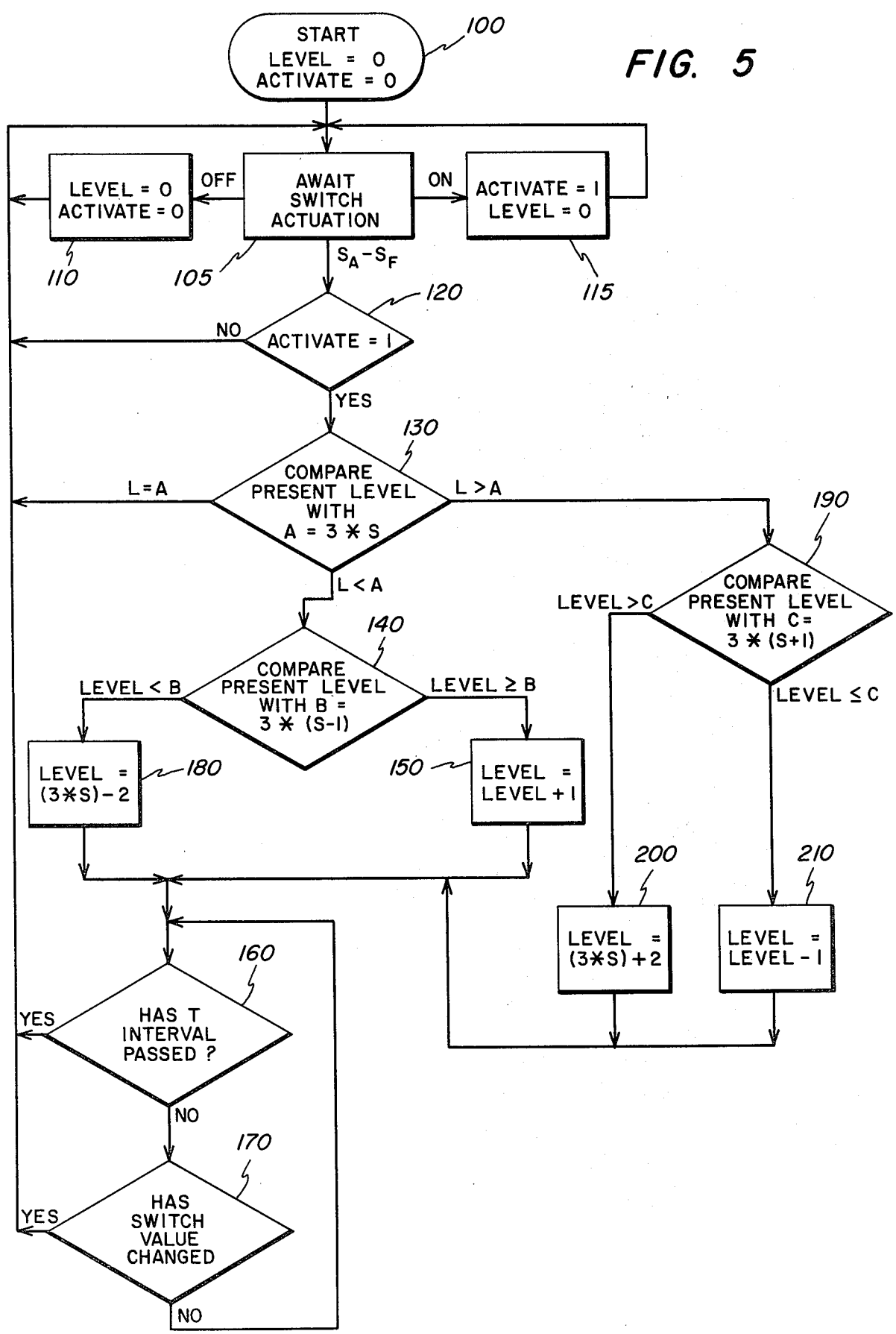

METHOD OF, AND APPARATUS FOR, INCREASED RESOLUTION SLEWING OF A BAR-GRAPH-DISPLAY DATA INPUT/OUTPUT SYSTEM

BACKGROUND OF THE INVENTION

The present invention is directed to data input/output systems utilizing a bar graph display and more particularly to a novel method of, and apparatus for, providing increased resolution slewing of a bar-graph-display input/output system.

It is known that bar graph displays may be utilized to provide visual indication of that one of a plurality of discrete levels to which a system is energized. While a single switch may be associated with the bar graph for initiating an increase or a decrease in the bar-graph-displayed level, it is more desirable that a plurality of the switch means be utilized to implement rapid system level selection. Heretofore, a separate switch was typically associated with each bar-segment and system-level. As displays with finer bar segments, having very narrow widths, come into use, the space available for the plurality of level-setting switches decreases. Accordingly, it is highly desirable to provide apparatus which has a single switch associated with several levels/bar segments, and in which a particular level/segment may be rapidly selected.

BRIEF DESCRIPTION OF THE INVENTION

In accordance with the invention, a method for increased resolution slewing of a bar-graph-display data input/output system, having a bar graph with $N=(Z*(S-1))+1$ bar segments, where S is the number of associated level-setting switches, and Z is an integer greater than 1, set the bar (and associated level) to that bar immediately above/below the next-lowest/next-highest switch-associated bar, when a switch respectively higher/lower than a previously-activated bar, is itself activated. Continued actuation of the selected switch causes the bar/and associated output level data to incrementally approach the actuated switch, with one approaching change occurring after a time level interval of a preselected duration.

In presently preferred embodiments, logic apparatus includes chain-coupled logic subcircuits, or a microcomputer for interfacing the switch means and bar graph segments, to carry out the above-summarized method.

Accordingly, it is one object of the present invention to provide a novel method for providing increased resolution in a slewing-type, switch-activated bar-graph-display data input/output system.

It is another object of the present invention to provide novel apparatus for enabling increased resolution in a data input/output system having a switch-activated, slewing-type bar graph display.

These and other objects of the present invention will become apparent upon consideration of the following detailed description of the presently preferred embodiments, when read in conjunction with the accompanying drawings.

BRIEF DESCRIPTION OF THE DRAWINGS

FIG. 1b is a schematic diagram of the switch-activated bar-graph-display portion of FIG. 1a;

FIG. 5 is a flow chart of the operational sequences of the circuit of FIG. 4.

DETAILED DESCRIPTION OF THE INVENTION

Figure 1A:
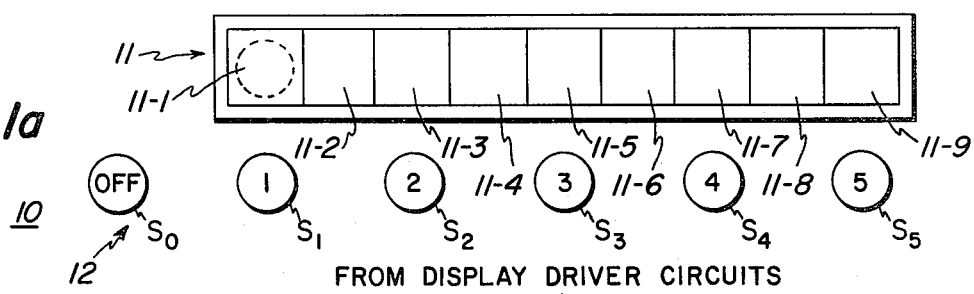
FIG. 1a is a plan view of one presently preferred switch-activated, bar-graph-display portion of a data input/output system, in accordance with the principles of the present invention.
Figure 1B:
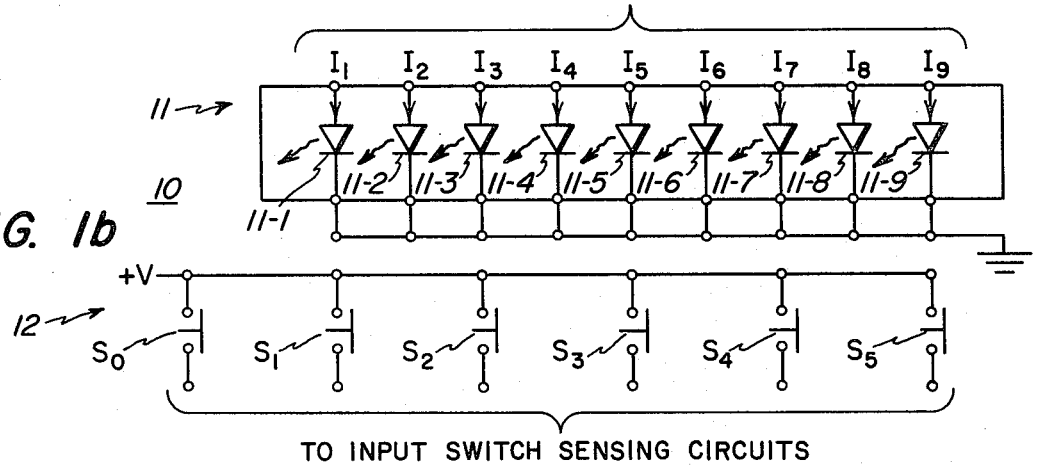

Referring initially to FIGS. 1a and 1b, a first presently preferred embodiment of bar-graph-slewing apparatus 10, utilizes a bar graph display portion 11 and an input switch portion 12. The input switch portion 12 includes a plurality M of switch means $S_1$–$S_M$ (where $M=5$ in the illustrated embodiment) plus an additional switch means $S_0$ acting as an OFF control. The switch means may be provided using any appropriate type of switch technology. It will be seen that a total of $(M+1)$ switch means (illustratively of the single-pole, single-throw push button type) are utilized. The bar graph display portion 11 includes another plurality N of individually-energizable display elements or segments 11-1 through 11-N, where N is greater than the number M of input switches. Therefore, each input switch may be utilized to control several display segments. The data, input to the system by activation of the switches, thus may control processes having a greater number of selectable levels, with each level being displayed by an associated increment of bar graph display portion 11. Thus, in the illustrated embodiment, bar graph display portion 11 has $N=(2M-1)$ display segments, e.g. segments 11-1 through 11-9, each of which segments includes an element, such as the illustrated light-emitting diode (LED), producing a visible display indication responsive to an associated one of a like number of individual stimuli, such as the associated driving currents $I_1$ through $I_9$. The currents are provided by display driver circuitry (to be described hereinbelow), which also receives the outputs of input switch sensing circuitry (also to be described hereinbelow) responsive to closure of one of switches $S_0$–$S_5$. Thus, there are a greater number of display portion segments than there are of input switching devices, with non-adjacent display segments being associated with sequential ones of the input switch devices. Display segments which are not directly associated with (i.e. not adjacent to) one of the input switching devices are interspersed between those of the display devices which are directly adjacent to an input switching device. The separate OFF input switch device $S_0$ is utilized only to turn the bar graph display apparatus to the "off" condition, while actuation of any of the remaining input switching devices $S_1$–$S_5$ not only turns the bar graph display portion 11 to the "on" condition, but also causes light emission from a bar of all segments up to, and including, the display segment selected, and a unique data output associated with the upper-most energized bar segment.

Figure 2A:
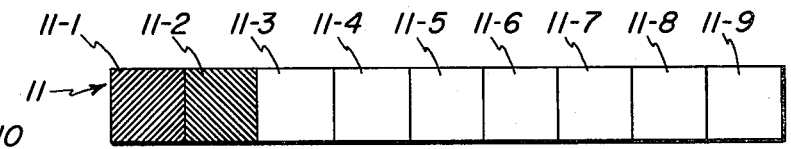
FIGS. 2a–2g are pictorial diagrams illustrating the manner of operation of the apparatus illustrated in FIGS. 1a and 1b.
Figure 2B:
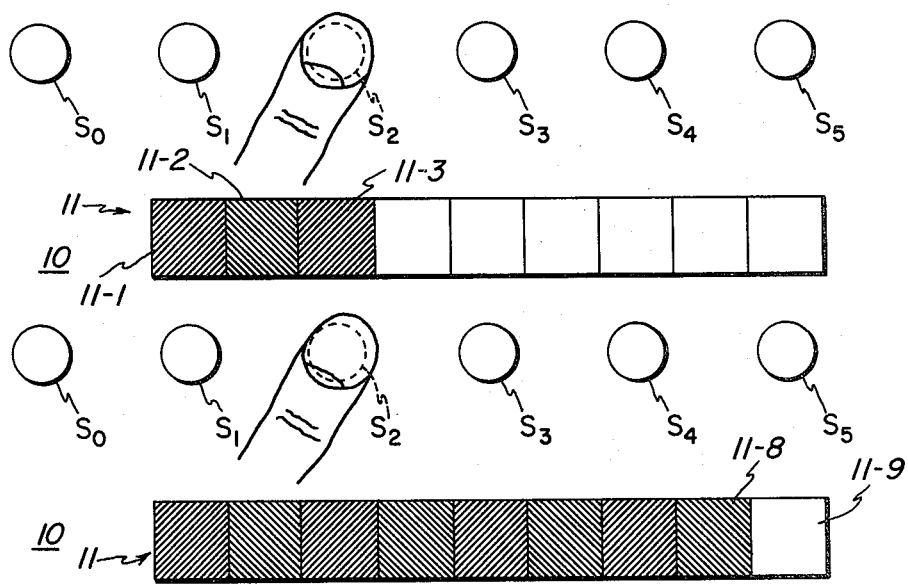

Referring now to FIGS. 2a–2g, the method by which the display is slewed to selected both those display segments directly associated with input switch devices and also the display segments therebetween, and general operation of the apparatus 10, is illustrated. In the illustrated embodiment, input switching devices $S_0$–$S_5$ may be touch-pad devices, push button switches and the like. Assume, initially, that apparatus 10 is in the "off" condition, as occurs either upon actuation of the OFF input switching device $S_0$ or upon initial application of power to the apparatus. All of bar graph display segments 11-1 through 11-9 are unlit and signals associated with each of the segments are all at a first condition, indicative of a zero-th (N=0) level system output being commanded. If an input switching device, at a position associated with a level greater than the level of the last-previously-actuated switching device, is itself actuated, the display actuates display segments including all segments up to the last-previously-actuated switching device, plus the next display segment for the initial actuation of the higher-level switching device. Continued actuation of the higher-level switching device causes increasingly-higher-level display segments to be actuated until the display segment directly associated with the actuated switch is itself lit. However, since there are no display segments below first display segment 11-1 (associated with lowest-level "on" switch $S_1$), depressing switch $S_1$ immediately lights display segment 11-1 and provides the apparatus data output with a signal representative the first (N=1) level; no further action is enabled by continued depression of switch device $S_1$. If the second non-OFF switching device $S_2$ is pressed, as shown in FIG. 2a, the immediate response is to activate the display segments up to, and including, the first segment above the segment directly associated with the immediately-lower-level switch ($S_1$); thus, segments 11-1 and 11-2 are immediately placed in the optically-activated e.g. lit, condition, as shown by diagonal hatching in the drawing. Simultaneously, the data output signal represents the second (N=2) level. That display segment, e.g. 11-3, directly associated with (above) the actuated switching device $S_2$ is not immediately actuated and remains in the dark condition, as do all of the higher-position display segments 11-4 through 11-9.

After a given interval, e.g. one-half second, continued or renewed actuation of the same input switching device, e.g. switch $S_2$, actuates the next-higher display segment, which is the display segment (in the illustrated embodiment) associated with, and above, the switching device $S_2$ being actuated. The data output signal for the associated (e.g. third, or N=3) level is also provided. Thus, the initial actuation of a particular switch, in the "increasing" mode, provides an initial output from the next-lowest position and continued actuation eventually provides an apparatus output associated with the display portion associated with the switch means being pressed.

Figure 2C:
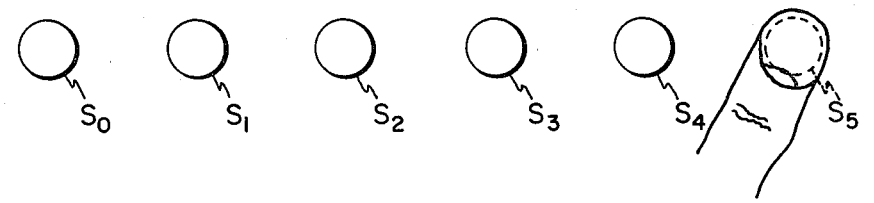
Figure 2D:
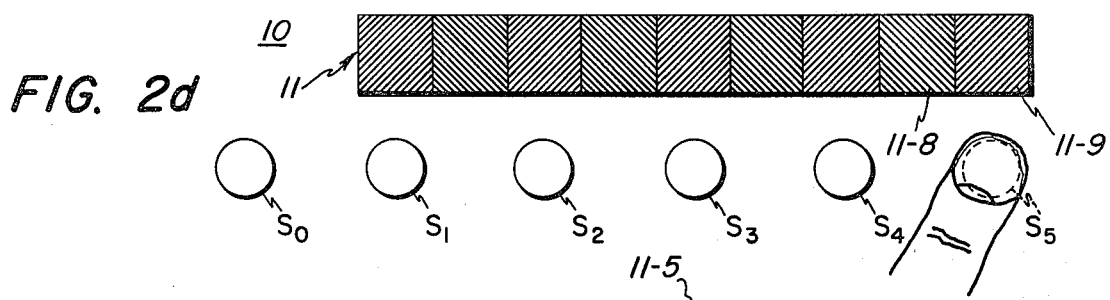

The "increasing" mode of operation is again utilized in FIG. 2c, where the highest-level input switching means $S_5$ is actuated. Immediately upon actuation thereof, the display segment, e.g. segment 11-8, immediately above the segment (11-7) associated with the next-lower switching device ($S_4$) is activated, as are all lower-level display segments, and the apparatus provides an output signal indicative of the eighth (N=8) level associated with the highest-lit display segment (11-8). If the same input switching device $S_5$ is continuously actuated (or reactuated), as in FIG. 2d, the next-highest display segment is lit, in addition to all lower-level display segments 11-1 through 11-8, and the ninth level N=9 output is present.

Figure 2E:
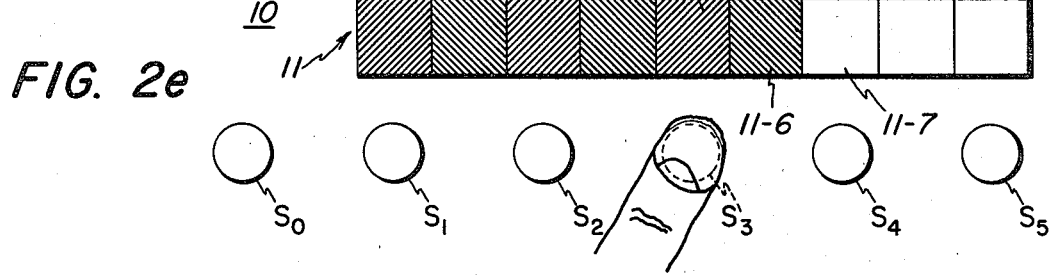
Figure 2F:
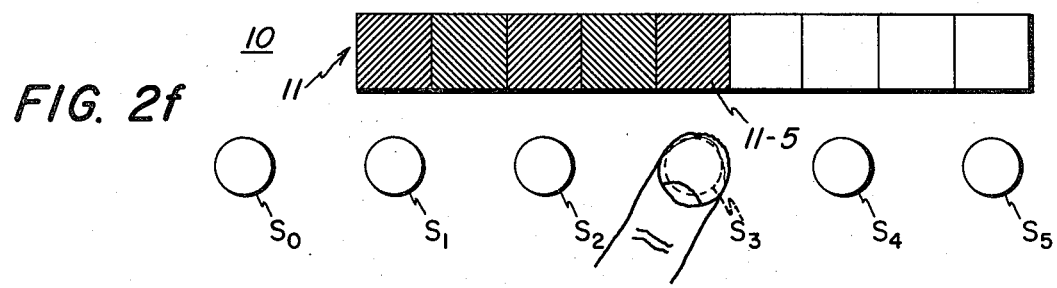

In FIG. 2e, the "decreasing" mode is enabled by actuation of a switching device, e.g. device $S_3$, of a level lower than the level of the last-previously-actuated switching device, e.g. $S_5$. The display immediately and directly moves toward the actuated switching device, stopping for the preselected time interval at a display segment, e.g. segment 11-6, immediately less than the display segment, e.g. segment 11-7, directly associated with that switching device, e.g. $S_4$, immediately above the actuated switch. All of the lower-order display segments 11-1 through 11-5 are also lit and a sixth level (N=6) output is present. If the switching device is then disabled, the display remains actuated up to the previously lit segment 11-6. If the switching device is reactivated, or continuously activated for longer than the preselected time interval, the graph decreases one display segment at the end of each preselected time interval. In the illustrated embodiment, continued switch $S_3$ activation causes a decrease of one segment of bar graph; the display (in FIG. 2f) is lit up to, and including, the display segment 11-5 immediately above actuated switching device $S_3$ and the fifth level (N=5) output is present. Continued actuation of the same switching device $S_3$ will not affect the bar graph display position.

Figure 2G:
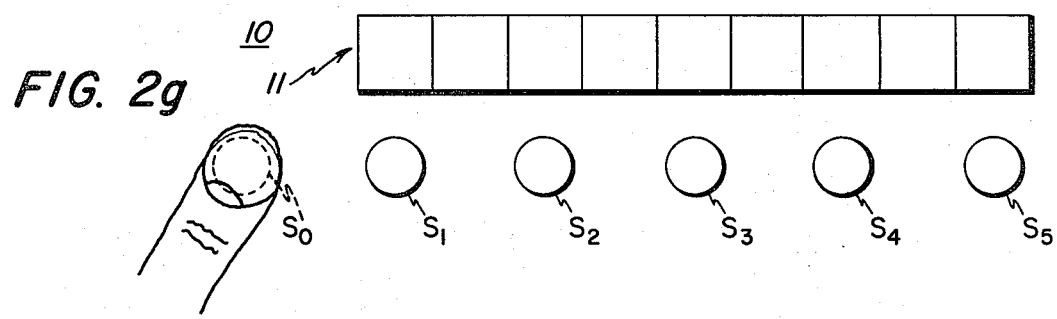

In FIG. 2g, actuation of the OFF switching means $S_0$ immediately enables the graph to the zero-th level, whereby all display segments are in the dark condition.

Figure 3:
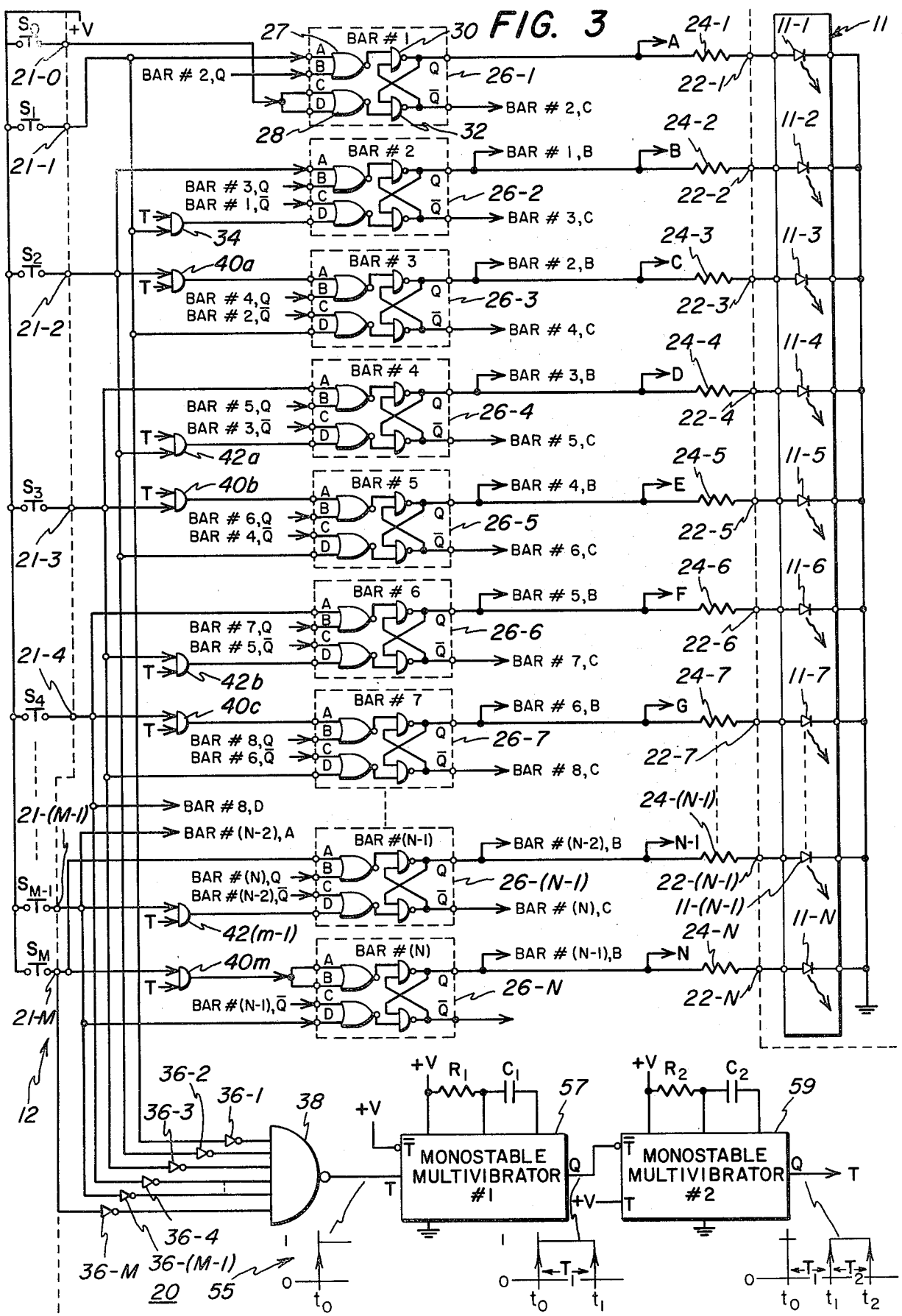
FIG. 3 is a schematic diagram of one presently preferred hardware implementation of circuitry for operating the switch-activated bar-graph-display in accordance with the principles of the application.

Referring now to FIG. 3, apparatus 20 for providing the input switch sensing and display driving functions, is coupled between the bar graph display 11 and the plurality of switching devices 12. Circuitry 20 includes a plurality (M+1) of inputs, 21-0 through 21-M, each coupled, through an associated one of the M level-switching input devices $S_1$ through $S_M$ and the OFF switching device $S_0$, to a source of switch-operating potential of magnitude +V. Circuitry 20 also has a plurality N of display segment driving outputs 22-1 through 22-N, each coupled to the associated one of display segments 11-1 through 11-N. Illustratively, each output is coupled to the anode of an associated one of the N light-emitting diodes of the N-segment bar graph display 11; each of the display diode cathode electrodes is connected to ground potential. In the illustrative embodiment, one of a like plurality of current-limiting resistances 24-1 through 24-N is connected in series between the associated circuitry output 22-1 through 22-N and the Q output of an associated one of N bar segment logic subcircuits 26-1 through 26-N.

Each of the bar-segment logic subcircuits 26 implements an NOR-gated-input set-reset flip/flop, in which first and second subcircuit inputs A and B are each coupled to an associated one of the first and second inputs of a first NOR-gate 27, and third and fourth subcircuit inputs C and D are each coupled to an associated one of the first and second inputs of a second NOR-gate 28 (see subcircuit 26-1). The output of gate 27 is coupled to a first input of a two-input NAND gate 30. The remaining input of gate 30 is cross-coupled to the Q output of the subcircuit. The output of gate 30 is coupled both to the $\overline{Q}$ output of the subcircuit and to one input of another two-input NAND gate 32, having its remaining input coupled to the output of NOR-gate 28; the output of gate 32 is connected to the Q output of the subcircuit.

The OFF switching device $S_0$ input 21-0 is connected to both C and D inputs of the bar 1 subcircuit 26-1. The first level-setting switching device $S_1$ input 21-1 is connected to: the A (first set) input of the bar 1 subcircuit 26-1; the D (second reset) input of the bar 3 subcircuit 26-3; one input of a first (reset steering) two-input NAND gate 34; and, through a first inverter 36-1 of a plurality M of inverters 36-1 through 36-M, to a first input of an M-input NAND gate 38. The output of gate 34 is connected to the D (second reset) input of the bar 2 subcircuit 26-2. The second level-setting switching device $S_2$ input 21-2 is connected to: the A (first set) input of the bar 2 subcircuit 26-2; a first input of a two-input (set steering) NAND gate 40a, having its output connected to the A (first set) input of the bar 3 subcircuit 26-3; a first input of another two-input NAND (reset steering) gate 42a, having an output connected to the D (second reset) input of the bar 4 subcircuit 26-4; the D input of the bar 5 subcircuit 26-5; and, through another inverter 36-2, to a second input of gate 38. The higher-level switches connect: through an associated set-steering NAND gate 40 to the A input of the associated-bar subcircuit; directly to the A input of the next-lower bar subcircuit; through an associated reset-steering NAND gate to the D input of the next-highest bar subcircuit; directly to the D input of the subcircuit of the bar associated with the next-higher-level switch; and through one of inverters 36 to one input of gate 38. Thus, the third level-setting switching device $S_3$ input 21-3 is connected directly to subcircuit 26-4 input A and subcircuit 26-7 input D, and also to one input of each of the set-steering NAND gate 40b and the reset-steering, NAND gate 42b, as well as to the input of inverter 36-3. Similarly, the fourth-level setting switching device $S_4$ input 21-4 is connected directly to the A input of subcircuit 26-6 and D input of a ninth bar subcircuit (not shown), as well as to one input of the set-steering gate 40c and to an input of a reset-steering gate (not shown) having its output connected to a D input of an eighth bar subcircuit. Input 21-4 is also connected through another inverter 36-4 to an input of gate 38.

The highest-level-setting switching device $S_M$ input 21-M is connected: directly to the A input of the next-lower subcircuit 26-(N−1); to one input of a set-steering gate 40n; and, through the M-th inverter 36-M, to an input of gate 38. There is no connection, either directly or through a reset-steering gate, to D inputs of higher-level subcircuits, as such subcircuits do not exist. The next-to-highest-level-setting switching device $S_{M-1}$ input 21-(M−1) is directly connected to: the A input of the bar (N−2) subcircuit; one input of the reset-steering gate 42-(M−1); via the next-to-last inverter 36-(M−1), to an input of gate 38; and to the D input of the highest-segment subcircuit 26-N.

The remaining B (second set) inputs of the individual bar subcircuits are each connected to the $\overline{Q}$ output of the next-higher-bar subcircuit, while the remaining C (first reset) inputs of the individual bar subcircuits are each connected to the $\overline{Q}$ output of the next-lower-bar subcircuit. Thus, the B input of subcircuit 26-1 is connected to the $\overline{Q}$ output of the bar 2 subcircuit 26-2; while the B inputs of the bar 2, 3, 4, . . . subcircuits are respectively connected to the $\overline{Q}$ outputs of the respective bar 3, 4, 5, . . . subcircuits. Similarly, the C input of the bar 2 subcircuit 26-2 is connected to the Q output of the bar 1 subcircuit, while the C inputs of the bar 3, 4, 5, . . . subcircuits are respectively connected to the Q outputs of the bar 2, 3, 4, . . . subcircuits.

The remaining inputs of all of gates 34, 40a through 40m and 42a through 42 (2M−1) are all connected to receive a common delay signal T, provided by delay circuit 55. Circuit 55 includes first and second multistable multivibrators 57 and 59, each having a true T trigger input, a not-true $\overline{T}$ trigger input, and a Q output which is enabled to a logic one level to a time interval $T_1$ and $T_2$, respectively, after a positive-going edge at the T input or a negative-going edge at the $\overline{T}$ input. The duration of the $T_1$ and $T_2$ pulses are established by the respective timing capacitors $C_1$ and $C_2$, and the respective timer resistors, $R_1$ and $R_2$. The T input of the first monostable multivibrator 57 is connected to the output of gate 38; the $\overline{T}$ input is connected to a positive logic level to prevent triggering thereat. The Q output of multivibrator 57 is connected to the $\overline{T}$ input of multivibrator 59; the T input thereof is connected to a positive logic level to prevent false triggering. The T signal for the set-steering and reset-steering gates is provided at the Q output of second multistable multivibrator 59.

In operation, at initial power-up, a reset signal is applied to the C-D inputs of subcircuit 26-1, to provide a Q output at a logic zero level therefrom, turning off the associated bar segment 11-1. As the $\overline{Q}$ output of subcircuit 26-1 is at the logic one level, the C input of subcircuit 26-2 resets the bar 2 and all higher-bar-number subcircuits to render all of the associated bar segments in the unlit condition.

Upon pressing any of the non-OFF switches, e.g. switch $S_3$, the next-lowest-bar subcircuit, e.g. the bar for subcircuit 26-4, receives a logic one level at the A input thereof. The Q output of that subcircuit, e.g. subcircuit 26-4, is enabled to logic one level lighting the associated bar segment 11-4. The presence of the logic one level at the Q output of subcircuit 26-4 is also present at the B input of the next-lowest-bar subcircuit 26-3, setting the Q output thereof, to enable the associated bar segment 11-3 and provide a logic one level to the B input of all lower-level subcircuits (subcircuits 26-1 and 26-2) to enable the display segments 11-2 and 11-1, thereof. As the $\overline{Q}$ output of subcircuit 26-4 is at the logic zero level, all of the higher-level bar subcircuits provide logic zero levels at the Q outputs thereof, and the associated bar segments 11-5 through 11-9 are unlit. The logic one level at input 21-3 is applied, via inverter 36-3, as a logic zero level to an input of gate 38. The output of gate 38 rises to a logic 1 level, at the time $t_0$ that the switch, e.g. $S_3$, is closed. The rising edge of this waveform trigger first monstable multivibrator 57; the Q output thereof rises to the logic one level and remains thereat for the time interval $T_1$ established by the values of the timing capacitor $C_1$ and timing resistor $R_1$. At the end of time interval $T_1$, the Q output of first multivibrator 57 falls to the logic zero level, providing the falling edge necessary to trigger second monostable multivibrator 59. The second multivibrator Q output provides a logic one pulse of time duration $t_2$, starting after the time interval $T_1$ has lapsed. If the switch has been released prior to time interval $T_1$ elapsing, the T pulse arrives at the remaining input at the associated gate (e.g. gate 40b), after the switch-supplied logic one level from switch $S_3$ has been removed. Therefore, the A input of the next highest subcircuit 26-5 remains at the logic zero level and the associated bar segment 11-5 does not light. Accordingly, only data outputs A-D are enabled to the logic one level; data outputs E and N are enabled to the logic zero level. If, however, switch $S_3$ has remained closed for at least time interval $T_1$ (or is re-closed and held closed for at least a T₁ time interval in this embodiment) the T pulse provides a logic one level at one input of gate 40b, simultaneous with the presence of the logic one level at the remaining input thereof. The resulting logic one level at the output of gate 40b is applied to the A input of bar subcircuit 26-5, activating the associated display segment 11-5 and providing the associated data output E at the logic one level. It should be understood that, while the circuitry of FIG. 3 is not configured to cause a bar directly associated with a particular switch to be immediately activated upon a re-actuation of the associated switch (after the next-lower bar segment is initially activated), modification to the circuitry is easily accomplished by means of an additional flip/flop logic element, enabled by the T output upon the first actuation of the associated switch, and subsequent OR gating, in each subcircuit.

In the "decreasing" mode, upon actuation of a lower-level switch, the circuit operates as follows: assume that the first five bar segments 11-1 through 11-5 are lit, whereby the Q outputs of subcircuits 26-1 through 26-5 are at the logic one level, as are the B inputs of subcircuits 26-1 through 26-4. Actuation of switch $S_2$ provides an immediate logic one signal to the D input of the fifth bar subcircuit 26-2, disabling the Q output thereof, turning off bar segment 11-5 and removing the logic one level at the B input of the next-lowest subcircuit 26-4. The Q output of subcircuit 26-4 remains set, due to the memory feature of the steered flip-flop subcircuit. The logic one level at switch $S_2$ input 21-2 is inverted by the associated inverter 36-2 and the resulting logic zero signal is applied to gate 38, providing a logic one rising-edge triggering signal to first multivibrator 57. After the T1 time interval, second multivibrator 59 is triggered and provides a logic one level T signal to one input of gate 42a. If switch $S_2$ is no longer activated, the output of gate 42a, and therefore of the associated subcircuit 26-4, does not change. All of bars 11-1 and 11-4 remain lit, and all of data outputs A-D remain at the logic one level. If switch 2 is still actuated after the T₁ time interval, a logic one level is provided by the T pulse to the remaining input of gate 42a. the resulting logic one level at the gate 42 output is applied to the D input of subcircuit 26-4, enabling the Q output thereof, with resulting disablement of the fourth bar segment 11-4 and switching of the fourth data output D to the logic zero level. Continued actuation of switch $S_2$ causes no further activity in the circuit, as the data output C, and bar segment 11-3 directly associated with that switch ($S_2$), have already been changed.

Actuation of the OFF switch $S_0$ immediately disables Q output of the first bar subcircuit 26-1, turning off all of the display segments and placing all of the data outputs at the logic zero level.

As a general rule, use of M+1 switches results in $N=(2M-1)$ bar segments and logic subcircuits; any subcircuit 26-K, associated with the K-th segment, where $1 \leq K \leq (2M-1)$, has its output $Q_K$ set for $Q_K = Q_{K+1} + Sj$, where $j=(K+2)/2$, for even K, and $Q_K = Q_{K+1} + (Sj' \cdot T)$, where $j'=(K+1)/2$, for all odd K greater than 1. At K=1, $Q_K = Q_{K+1} + Sj'$. The K-th subcircuit $\overline{Q_K}$ output is enabled for $\overline{Q_K} = \overline{Q_{K-1}} + Sj$, where $j=(K-1)/2$, for all odd K, and $\overline{Q_K} = \overline{Q_{K-1}} + (Sj' \cdot T)$, with $j'=K/2$ for all even K.

Figure 4:
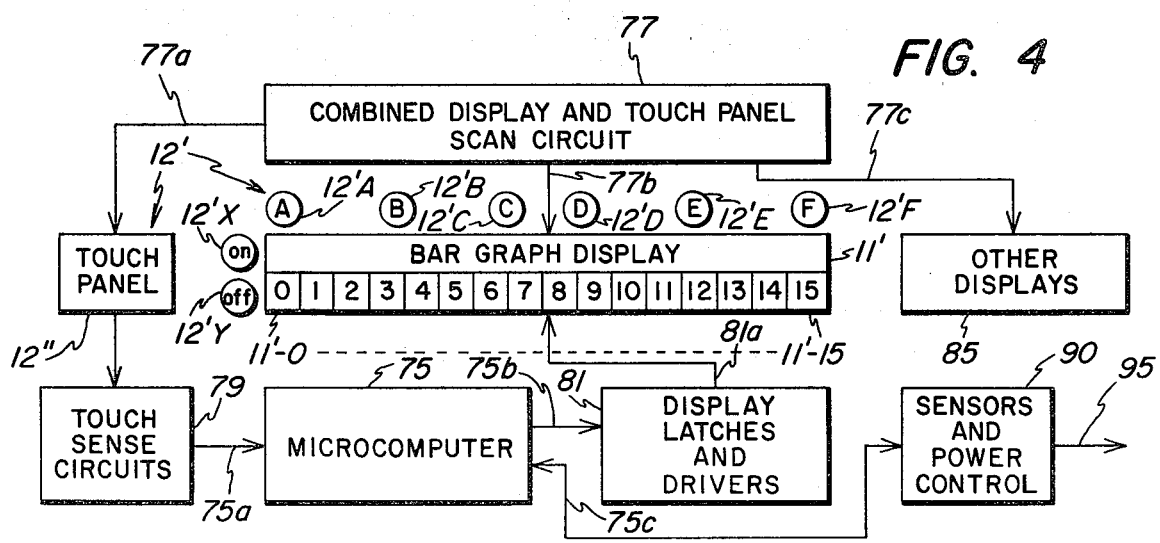
FIG. 4 is a block diagram of another presently preferred embodiment of the present invention, utilizing microcomputer control therefore.

Referring now to FIG. 4, apparatus 70, under control of a microcomputer 75, utilizes a touch-entry switch subsystem 12' having 6 active level-setting switch means 12'A through 12'F. In this embodiment, two bar segments are used between each segment directly associated with one of the six touch pads. The total number N of display bar segments will be equal to $((Z^*(S-1))+1)$, where Z is the number of segments associated with a switch and is one greater than the number of bar segments used between each segment directly associated with one of S input means. Therefore, for Z=3 and S=6, $N=((3^*(6-1))+1$ or N=16 and a bar graph display 11' has 16 bar segments 11'-0 through 11'-15. The input switching section 12' utilizes a touch panel 12" having, in the illustrated embodiment, an ON switch 12'X and OFF switch 12'Y, in addition to the six level-setting touch pad switches 12'A through 12'F. The touch panel and sense circuits, while having circuitry shown in block form at the left of FIG. 4, (which may be of the type described and claimed in co-pending U.S. applications Ser. Nos. 068,753, filed Aug. 23, 1979, and 088,287 filed Oct. 26, 1979 and now respectively U.S. Pat. Nos. 4,291,303 and 4,290,052, respectively issued Sept. 22, 1981 and Sept. 15, 1981, and incorporated herein in their entirety by reference) may have a physical layout, associated with display portion 11', as shown in the center of the figure. Touch panel 12" provides output signals, responsive to touch panel scan pulses from an output 77a of combined display and touch panel scan circuit 77, to touch sense circuits 79, themselves providing data as to which, if any, of the plurality (e.g. 8) of the touch-pads has been actuated, to an input data port 75a of the microcomputer. The combined display and touch panel scan circuit may be of the type described and claimed in the aforementioned U.S. patent application Ser. No. 068,753 (now U.S. Pat. No. 4,291,303). The microcomputer has an output data port 75b providing actuated-touch-pad data to display latch and driver means 81, which latches such data for driving the segments of bar graph display 11'. The bar graph may be of the scanned variety, receiving scan signals from another output 77b of the combined display and touch panel scan circuit 77. Other forms of displays 85 may be enabled by other signals from still another output 77c of circuit 77. Power control means 90 receives the switch level information from output data port 75c of the microcomputer responsive to information from touch-panel 12" and touch sense circuits 79 to provide signals, via a bus 95, to control other apparatus (not shown). Means 90 also may include sensors to monitor the controlled process. As previously mentioned, the scanned touch panel and display circuitry may be as disclosed and claimed in co-pending U.S. patent application Ser. Nos. (068,753 and 088,287) (now respectively U.S. Pat. Nos. 4,291,303 and 4,290,052) although other circuitry for elements 11', 12', 77, 79, 81 and 85 may be equally as well utilized. Microcomputer 75 could be any commercially available microcomputer (such as the INTEL 8085 and the like) with such read-only memory, random-access memory and input/output support (as may be provided by INTEL 2732 and 8155 integrated circuits and the like) as required for the particular end use.

In operation, assuming that apparatus 70 is utilized, for example, to control the temperature in an oven, use of touch switches 12'X and 12'Y provide positive ON and OFF control of power control means 90, utilized to connect the electrical power mains to the oven heating apparatus. Sensors within the oven may be utilized with analog-to-digital conversion means, forming a part of sensors and power control means 90, to provide oven-temperature digital information to microcomputer data input port 75c.

Operation of the oven thus commences with actuation of ON switch 12'X, followed by touching that one of level-setting switches 12'A-12'F immediately above the bar segment either associated with, or higher than, the desired temperature. The switch is touched only as long as necessary for the display input/output apparatus to slew the highest-level bar segment of the display to that temperature desired. The touch switch is then released. The associated level is sensed by touch sense circuit 79 and the data therefore is applied to input port 75a of the microcomputer, causing power control means 92 to receive data enabling the oven to commence heating. The oven cavity temperature is sensed and temperature information is sent back to microcomputer input port 75c, where comparison between the commanded and actual temperature data is made; further commands may then be issued to means 90 to cause the oven cavity temperature to reach the desired level and to be maintained thereat.

FIG. 5 illustrates a logic flow chart for the operation of apparatus 70, utilizing the separate ON and OFF switches 12'X and 12'Y, with six level-settings switches 12'A-12'F and a 16 segment bar graph display 11'. The 20 line assembler program utilized to implement this subroutine, with the aforementioned microcomputer and in the aforementioned application, is appended to this application.

Apparatus 70 is initially powered up as by completion of the circuit to the power mains. The initial application of power acts to reset microcomputer 75, causing the program to enter the START step 100. An assigned level register is initialized to the zero-th level (LEVEL=0) and an Activate flag (indicative of whether or not the controlled apparatus is to be activated or inactivated) is set to a logic zero. Simultaneously therewith, touch panel scan circuit 77 commences transmission of scan pulses, at output 77a, to touch panel 12''. As none of the touch switches have yet been activated, touch sense circuits 79 provide zero-touch indications to microcomputer input port 75a. Responsive thereto, microcomputer output board 75b provides "unlit" indications for all of the bar graph display segments, to display latches and drivers 81. Display scan circuits 77 also provides display scan signals at outputs 77b, which combine with the "unlit" signals latched in means 81 to render all of the bar display segments in the unlit condition. Having been initialized, the program advances to step 105 and waits until one of switches 12'A-12'F, 12'X or 12'Y is pressed. Upon touching one of the eight touch-switches, the touch is sensed by circuit means 79 and data associated therewith is provided at microcomputer input port 75a. If OFF switch 12'Y has been pressed, the program step 105 recognizes this "off" indication and exits to step 110. In step 110, the level data and the activate flag are both set to logic zero levels, indicative of the controlled apparatus being entirely in the "off" condition; the program returns to step 105 and waits until another one of switches 12' is activated. If the ON switch 12'X has been pressed, step 105 recognizes the "on" condition and exits to step 115. In step 115, the activate flag is set to a logic one level, indicative of the control apparatus having been turned on, but the level data is maintained at the zero level, as level-setting switches 12'A-12'F have not yet been activated to select a controlled-apparatus level; the program returns to step 105 to await activation of another switch. If one of switch means 12'A-12'F has been pressed, step 105 recognizes the touch-sense data and assigns thereto a switch number 0-5, corresponding to switches 12'A-12'F, respectively. Step 105 then exits to decision step 120. In step 120, the activate flag is queried. If the activate flag is found to be equal to zero, indicative of the apparatus being in the OFF condition, the activation of a level-setting switch is ignored and the procedure returns to step 105. If the ON switch has previously been pressed and the activate flag set to a logic one level, level-setting data can be accepted and step 120 exits to comparison step 130.

In step 130, the present level L is compared with a first computer integer A, equal to the product of the number of bar segments Z associated with each switch means (e.g. 3) in the apparatus in use, times the switch number S (numbering the switches from 0 to increasing integer values) of the activated switch. Thus, switch 12'A has a switch number of S=0, switch 12'B has a switch number S=1,..., and switch 12'F has a switch number S=5. In this configuration, first level-setting switch 12'A is used only in the "decreasing" mode. That is, in the "increasing" mode, actuation of switch 12'A sets S=0 and step 130 compares the present level L=0 to A=(3*0)=0; finding an equivalence, step 130 exits back to WAIT step 105. If one of switches 12'B-12'F (with a non-zero S number) is actuated (e.g. switch 12'B, with S=1, is actuated), the present level (e.g. zero) is compared with three times the switch number (e.g. A=3*1=3.) If the comparison indicates that the present level L is less than A, which is indicative of the "increasing" mode, comparison step 140 is entered. The present level (e.g. zero) is compared against a second computed integer B, equal to the product of one less than the number of the actuated switch, times three (e.g. B=3*(S−1)=0); if the present level (zero) is greater than or equal to the product (zero) step 140 exits to step 150. In step 150, a new level is established at one level greater than the original level; in the illustrative sequence, the new level is one greater than the original zero level or a new level of one. Bar graph display segment 11'-0 is lit and power control means 90 receives a first level data signal from microcomputer output port 75c. Upon completion of level changing step 150, comparison step 160 is entered, wherein passage of the T time interval is checked. The T time interval signal may be provided by a circuit similar to circuit 55 of FIG. 3 or may be provided by a counter-timer register within microcomputer 75. The timer register contents may be cyclically incremented and checked against a fixed T interval value. If the preselected T time interval has passed, step 160 returns to the Wait step 105. If the T interval has not passed step 160 exits to step 170, wherein the switch means 12' is checked for a change in switch value. Thus, if a new switch has been pressed during the time interval, step 170 exits to step 105, whereupon the new switch-pressed indication restarts the entire sequence. If the switch value has not changed, step 170 loops back to step 160 and again checks for the end of T time interval. The loop continues until either the switch value has changed or the time interval T is over, at which time a further switch actuation causes step 105 to exit to one of steps 110, 115 or 120.

In the example, wherein switch 12'B (S=1) was pressed and the level initially changed to light first bar segment 11'-0 continued actuation of switch 12'B causes step 105 to exit through step 120 to step 130. The comparison of the present level L=1 with A=3, will find that L is still less than A, and step 130 exits to step 140. The comparison of L=1 with B=0 yields that the level is greater than the product B, and step 150 is again entered; the new level is set to one greater than the previous one L=1, whereby the second level L=2 is commanded by the microcomputer. The power controller receives digital data implementing this next-higher level and display latch and driver means 81 receives data which, when combined with the scan signals from output 77b, causes the first two bar segments 11'-0 and 11'-1 of bar graph display 11' to light.

If switch 12'B is still actuated, after completion of the loop of steps 160–170 steps 105 and 120 are again completed and step 130 entered. The present level L=2 is compared with A=3 and as L is still less than A, step 130 again exits to step 140. In step 140, present level L=2 is compared with B=0, and as L is again greater than B, step 150 is again entered to increment the level to L=3. Display 11' now has the first three segments 11'-0 through 11'-2 thereof in the lit condition. Note that any continued actuation of switch 12'B again returns the sequence to step 130 where the present level L=3 is compared with computed integer A=3. As an equivalence obtains, step 130 exits back to step 105, and a further increase the number of lit bar graph display segments (and corresponding output control level) will not occur, unless a higher number switch is actuated.

If switch 12'D, for example, is now actuated, the apparatus is still in the "increasing" mode. The switch number is such that S=3. Actuation of the switch causes step 105 to exit through step 120 to step 130, wherein the present switch level L=3 is compared to A=3*3=9; as L is less than A, step 140 is entered. In step 140, the present level L=3 is compared with B=3*2=6; the present level is less than the B computered number, and step 180 is entered. The level is immediately set equal to (3*3)−2 or L=7, in the example. This immediate-set level is, it will be noted, one level greater than the highest level (e.g. level 6) settable with the switch means (e.g. 12'C) next-lower then the actuated switch means (e.g. 12'D). Thus, microcomputer 75 sends power control means 90 and display latch and driver means 81 data for the seventh level. Bar graph display 11' displays the seventh level by lighting bar segments 11'-0 through 11'-7. If switch means 12'D is still actuated after time interval T, the sequence loops back through steps 105 and 120 to step 130. As the new level L=7 is still less than A=9, step 140 is entered. Level L=7 is greater than B=6, and step 150 is entered to increase the level to L=8, whereby bar segments 11'-0 through 11'-8 are lit. Continued depression of switch 12'D again brings the sequence to step 130, where the present level L=8 is compared with A=9 and step 140 is again entered. The comparison L=8 with B=6 again causes step 150 to be entered and the level is increased to L=9, causing bar segments 11'-0 through 11'-9 to light. Simultaneously, power control means 90 is actuated the eighth level in the controlled apparatus. Continued actuation of switch 12'D now causes step 130 to find that L=9 is equivalent to A=9 and the microcomputer continues looping through steps 105, 120 and 130, without changing the digital data to means 90 or 81; the bar graph display does not change.

In the decreasing mode, if switch 12'B (with S=1) is now actuated, the actuation causes step 105 to exit to step 120. As the Activate flag is still set to a logic one level, step 130 is entered. The present level L=9, for example, is compared to a new computed integer A=3*1=3. As L is greater than A, another comparison step 190 is entered. The present level L=9 is compared with another computered integer C=3*(S+1)=3*2=6. As the present level is greater than computed number C, step 190 exits to step 200, wherein the level is immediately set to (3*S)+2 or L=5. Therefore, the power control means 90 and display latch means 81 immediately receive digital data setting the fifth level, whereby the graph display segments 11'-0 through 11'-5 are lit. It should be noted that this level L=5 is one less than the level L=6 directly associated with the next-higher switch 12'C.

Continued actuation of switch 12'B moves the sequence through steps 105 and 120 to step 130. As the new level L=5 is still greater than computed number A=3, step 190 is entered. As present level L=5 is now less than computed number C=6, step 210 is entered. In step 210 the level is set to the next lower level, e.g. to L=4. Digital data is provided to means 81 and 90 for the decrease in level, and bar segment 11'-5 is extinguished, whereby only bar segments 11'-0 through 11'-4, indicative of level L=4 being actuated, are lit. Continued actuation of switch 12'B again brings the sequence to step 130, wherein the present level L=5 is compared with computed integer A=3. As the level is still greater than integer A, step 190 is again entered. As level L=4 is less than integer C=6, step 210 is again entered and the level is decremented to L=3 (the level directly associated with switch 12'B). Continued actuation of 12'B does not change the output level L=3, and does not change the bar graph display, in which only segments 11'-0 through 11'-3 remain lit.

If switch 12'A (S=0) is now actuated, the sequence goes through steps 105 and 120 and is entered. The present level L=3 is compared against computed integer A=3*0=0, whereby step 190 is again entered. The level is decremented once, to level L=2. Continued actuation of switch 12'A will decrease the level to L=1 (with bar segments 11'-0 and 11'-1 lit) and thence, if switch 12'A is still actuated, to the zero-th level L=0, with only bar segment 11'=0 in the lit condition. Continued actuation of switch 12'A thereafter does not change level or number of bar segments lit.

Actuation of the OFF switch 12'Y is sensed in step 105 and causes step 110 to be entered. The level is immediately set and the Activate flag bit is set to a logic zero level. It will be seen that, with the system at level L=0, a "decreasing" mode actuation can only be provided by actuation of OFF switch, although the "increasing" mode of operation is established by actuation of a higher-numbered switch means.

While several presently preferred embodiments of our method and apparatus for increased resolution of slewing of a bar-graph-display data input/output system have been described herein, many variations and modifications will now become apparent to those skilled in the art. For example, any number Z of bar segments (levels) may be associated with a particular switch means, with the steps of FIG. 5 being modified only to the extent of computing integers A=Z*S, B=Z*(S−1), and C=Z*(S+1), in addition to having step 180 set "Level=(Z*S)−(Z−1)" and step 200 set "Level=(Z*S)+(Z−1)". It is our intent, therefore, to be limited only by the scope of the appending claims and not by the specific details presented herein.
U.S. patent application Ser. No. 212,963

```
10 REM Function RSwitch Reads Switch, On=6,
   OFF=7,
20 REM nothing pressed=8 else 0-6 for switch pressed
30 level=0: REM Unit Off
40 Activate=0
50 S=RSWITCH: If S=8 Then go to 50
60 If S=6 go to 90: REM "ON"
70 If S=7 go to 30: REM "OFF"
80 go to 100
90 ACTUATE=1: level=0: got to 50: REM Unit now
   activates
100 If Activate=0 then go to 50: REM Unit Off
110 If level=(3*S) Then go to 50: REM do nothing
120 If level>3*S Then go to 150
130 If level<3*(S−1) Then level=(3×S)−2: go to
    170
140 level=level+1: go to 170
150 If level>3*(S+1) Then level=(3×S)+2: got to
    170
160 level=level−1
T=TIME: REM Time returns a number, incremented
   60 times/second
180 If S<>RSWITCH Then go to 50: REM new
    switch state
190 If TIME>T+30 Then go to 50; timed out
200 Go to 180
```

What is claimed is:

1. Data input/output apparatus, comprising:
   a plurality M, where M is an integer greater than 1, of individually and singly actuateable data input means for providing only one of a like plurality M of data input signals at any time;
   a bar graph display having a plurality $N=(Z^*(M-1)+1)$, where Z is an integer greater than 2, of individually-actuateable display bar segments, each segment corresponding to a different one of a like plurality N of apparatus data output levels;
   data output means at which is provided one of a plurality N of different data output signals, each associated with the highest presently-actuated bar segment of said display; and
   means for selecting a chosen one of the plurality N of data output signals and immediately enabling, upon actuation of a chosen input means directly associated with a bar segment greater than a presently-actuated bar segment, a data output signal and an associated bar display of up to and including that bar segment at a level immediately above the bar segment directly associated with that input means next lower than the chosen actuated input means, and then, if said chosen input means remains actuated, sequentially enabling successively higher levels and associated additional bar segments, up to and including the bar segment and level associated with the chosen actuated input means, after each of a like number of time intervals; said enabling means also for immediately enabling, upon actuation of a chosen input means associated with a bar segment less than a presently-actuated bar segment, a data output and an associated bar display of up to and including that bar segment at a level immediately below the bar segment directly associated with that input means next higher than the chosen actuated input means, and then, if said chosen input means remains actuated, sequentially disabling successively lower levels and associated additional bar segments, down to but not including the bar segment and associated level associated with the chosen actuated input means, after each of a like number of time intervals.

2. The apparatus of claim 1, wherein said data input means comprises a plurality of individually activateable switches.

3. The apparatus of claim 2, wherein each of said switches is a pushbutton switch.

4. The apparatus of claim 2, wherein each of said switches is a touch pad switch.

5. The apparatus of claim 1, wherein said bar graph display comprises a plurality N of sequentially arranged light emitting diodes.

6. Data input/output apparatus, comprising:
   a plurality M, where M is an integer greater than 1, of individually and singly actuateable data input means for providing only one of a like plurality M of data input signals at any time;
   a bar graph display having a plurality $N=(Z^*(M-1)+1)$, wherein $Z=2$, of individually-actuateable display bar segments, each segment corresponding to a different one of a like plurality N of apparatus data output levels;
   each of said data input means being numbered consecutively from 1 to M and directly associated respectively with the first, (1+Z)-th, (1+2Z)-th, ..., (N−2Z)-th, (N−Z)-th and the N-th bar segment and output level;
   data output means at which is provided one of a plurality N of different data output signals, each associated with the highest presently-actuated bar segment of said display; and
   means for selecting a chosen one of the plurality N of data output signals and enabling, upon actuation of a chosen input means directly associated with a bar segment greater than a presently-actuated bar segment, a data output signal and an associated bar display of up to and including that bar segment at a level immediately above the bar segment directly associated with that input means next lower than the chosen actuated input means, and then, if said chosen input means remains actuated, sequentially enabling successively higher levels and associated additional bar segments, up to and including the bar segment and level associated with the chosen actuated input means, after each of a like number of time intervals; said enabling means also for enabling, upon actuation of a chosen input means associated with a bar segment less than a presently-actuated bar segment, a data output and an associated bar display of up to and including that bar segment at a level immediately below the bar segment directly associated with that input means next higher than the chosen actuated input means, and then, if said chosen input means remains actuated, sequentially disabling successively lower levels and associated additional bar segments, down to but not including the bar segment and associated level associated with the chosen actuated input means, after each of a like number of time intervals;
   said selecting means including a plurality N of logic subcircuits each having a latched true Q output and a latched complementary $\overline{Q}$ output, and set and reset inputs for, respectively, setting and resetting the Q output and resetting and setting the $\overline{Q}$ output, responsive to set and reset signals at the respective set and reset inputs; and means receiving all of said data input signals for providing a sequence of Z pulses, the first one of which pulses occurs at a preselected time interval after actuation of one of said data input means and the remaining ones of said pulses occurring sequentially after said predetermined time interval has elapsed after the immediate previous pulse; the N logic subcircuits being interconnected to cause the Q output of the k-th subcircuit, where $1 \leq k \leq N$, to be set immediately if the (k+1)-st subcircuit Q output is set or if the j-th data input means, where $j = (k+2)/2$ for all even k, is actuated and to be set after a time interval T if the j'-th data input means, where $j' = (k+1)/2$ for all odd k greater than 1, is actuated and remains activated for at least the entire time interval T; the first (k=1) logic subcircuit having the Q output thereof also set immediately if the first input means is activated; the logic subcircuits also being coupled each to the other to cause the Q output of the k-th subcircuit to be set immediately if the (k-1)-st Q output is set or if the i-th input means, where $i = (k-1)/2$ for all odd k, is activated and to be set after said time interval T if the i'-th input means, where $i' = K/2$ for all even k, is activated and remains activated for the entire T time interval; each of said bar segments and output signals being enabled by the Q output of the associated subcircuit.

7. The apparatus of claim 6, wherein each logic subcircuit includes first and second 2-input NAND gates, each having an output coupled to one of the Q and $\overline{Q}$ outputs and to one of the inputs of the remaining NAND gate, a first OR gate having at least one input receiving the set input signals and an output coupled to a remaining input of that NAND gate and having its output coupled to the Q output; and a second OR gate having at least one input receiving the reset input signals and an output coupled for a remaining input of that NAND gate having its output coupled to the $\overline{Q}$ output.

8. The apparatus of claim 6, wherein said pulse providing means includes first and second monostable vibrators each having a trigger input and output at which a pulse appears responsive to the presence of a signal at the associated trigger output thereof; and logic gating means for providing a triggering input to the first multivibrator upon actuation of any one of said data input means, said second multivibrator being actuated by the cessation of the pulse from said first multivibrator to provide each of said pulses.

9. The apparatus of claim 1, further comprising an additional switch means, and wherein said enabling means also controls said data output to a zero level and turns off all of said display segments immediately upon actuation of said additional data input means.

10. The apparatus of claim 1, wherein said enabling means includes a microcomputer having an input data port receiving the data input signals and an output data port providing said data output levels; and means coupled to said data output port for actuating said display bar segments in accordance with said data output levels.

11. A method for increased resolution slewing of a data input/output system, comprising the steps of:
(a) providing a first plurality M, where M is an integer greater than 1, of singly and independently-actuateable data input means each for enabling only one of a like plurality M of data input signals at any time;
(b) providing a bar graph display with a second plurality $N = (Z*(M-1)+1)$, where Z is an integer greater than 2, of individually-actuateable display bar segments, each segment corresponding to a different one of a like plurality N of data output levels;
(c) providing data output means at which a chosen one of said N data output levels is to be provided;
(d) selecting a single data input means which if a desired data output level is greater than a presently-enabled output level, is the next-highest data input means directly associated with a bar segment above that bar segment corresponding to the desired output level, and, if a desired data output level is less than a presently-enabled data output level, is the next-lowest data input means directly associated with a bar segment below that bar segment corresponding to the desired output level;
(e) actuating the single selected data input means to immediately enable that bar segment immediately above the bar segment associated with the next-lowest data input means, if the desired data output level is greater than the presently-enabled output level, or, if the desired data output level is less than the presently-enabled data output level, to immediately enable that bar segment immediately below the bar segment associated with the next-highest input means; and
(f) maintaining said single selected data input means in the actuated condition while the bar segments are sequentially enabled or disabled until the highest bar segment of the bar graph display moves to the bar segment corresponding to the desired output level, to provide the desired output level at said the data output means.

12. The method of claim 11, wherein step (f) includes the step of causing a selected time interval to transpire before the bar of said display and the associated data output level respectively change to the next sequential bar segment and the associated output level, respectively.

13. The method of claim 12, further comprising the step of providing an additional data input means for disabling all bar segments of the display and providing a system-off output level to the output means.

14. The method of claim 13, further comprising the step of providing another data input means which must be enabled to allow the first plurality of input means to become operational, enablement solely of said another data input means maintaining the data output level at said output means at said system-off level.

* * * * *